United States Patent [19]

Yonemoto

[11] Patent Number: 5,293,237
[45] Date of Patent: Mar. 8, 1994

[54] CCD IMAGE SENSING DEVICE HAVING A P-WELL REGION WITH A HIGH IMPURITY CONCENTRATION

[75] Inventor: Kazuya Yonemoto, Tokyo, Japan
[73] Assignee: Sony Corporation, Tokyo, Japan
[21] Appl. No.: 880,904
[22] Filed: May 8, 1992
[30] Foreign Application Priority Data
  May 10, 1991 [JP] Japan .................................. 3-105597
[51] Int. Cl.⁵ ............................................ H04N 5/335
[52] U.S. Cl. .................................... 348/314; 257/223; 348/243; 348/249
[58] Field of Search ...................... 358/213.11, 213.15, 358/213.19, 213.23, 213.27, 213.29; 257/223, 230, 232, 233, 241, 912; H04N 5/335

[56] References Cited

U.S. PATENT DOCUMENTS

| | | | |
|---|---|---|---|
| 4,467,341 | 8/1984 | Suzuki | 357/24 |
| 4,654,682 | 3/1987 | Boudewijns | 357/24 |
| 4,760,435 | 7/1988 | Burt | 357/24 |
| 4,814,848 | 3/1989 | Akimoto et al. | 257/24 |
| 4,851,890 | 7/1989 | Miyatake | 357/24 |
| 5,057,926 | 10/1991 | Watanabe | 358/213.11 |
| 5,115,458 | 5/1992 | Burkey et al. | 377/58 |
| 5,130,774 | 7/1992 | Stevens et al. | 357/24 |

FOREIGN PATENT DOCUMENTS 0185343 6/1986 European Pat. Off. ...... H01L 27/14
3302725 8/1983 Fed. Rep. of Germany ......... H01L 27/14

OTHER PUBLICATIONS

1190 IEEE International Solid-State Circuits Conference, 14 Feb. 1990, San Francisco, USA; Kazuya Yonemoto, et al., "A 2 Million Pixle Fit-CCD Image Sensor for HDTV Camera System", pp. 214-215, 299.

Primary Examiner—Joseph Mancuso
Assistant Examiner—Tuan V. Ho
Attorney, Agent, or Firm—Hill, Steadman & Simpson

[57] ABSTRACT

A CCD image sensing device has vertical shift registers (22), a horizontal shift register (3A), a horizontal transfer gate (4), a horizontal shift register (3B), a smear gate (6), a smear drain region (7) and a channel stop region (8) arranged in that order on an n-type substrate (N-Sub). A p-well region underlying the vertical shift registers (22), the horizontal shift register (3A), the horizontal transfer gate (4), the horizontal shift register (3B) the smear gate (6), the smear drain region (7) and the channel stop region (8) is doped in a high impurity concentration to stabilize the potential of the p-well region at a potential substantially equal to that of the channel stop region (8), i.e., ground potential (GND). Consequently, no hole storage region is formed in the p-well and hence the deterioration of the signal transfer performance can be prevented. Since no hole-depletion region is created, no dark current due to avalanche is produced.

4 Claims, 7 Drawing Sheets

CCD IMAGE SENSING DEVICE HAVING A P-WELL REGION WITH A HIGH IMPURITY CONCENTRATION

BACKGROUND OF THE INVENTION

1. Field of the Invention

The present invention relates to a CCD image sensing device.

2. Description of the Prior Art

Figure 1:
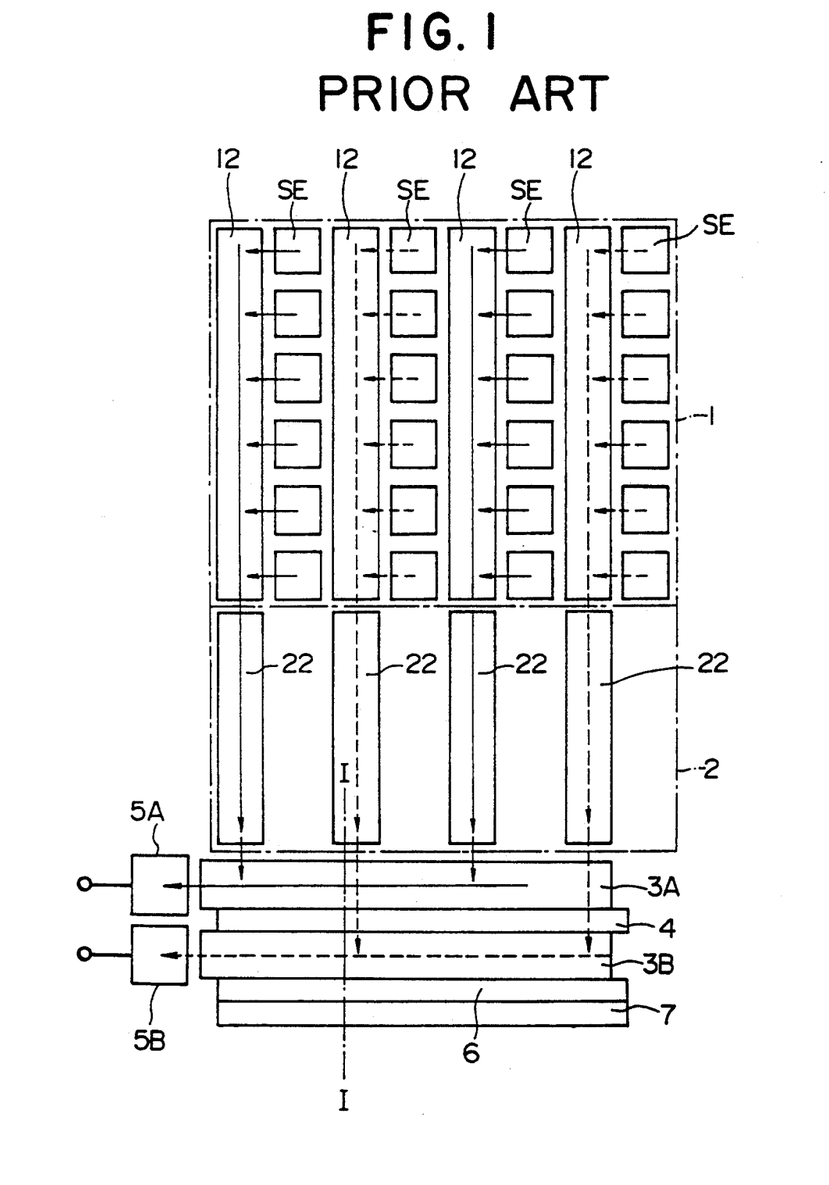
FIG. 1 is a diagrammatic view showing the construction of a CCD image sensing device of a FIT system.

FIG. 1 shows the construction of a CCD image sensing device of a frame intertransfer system (FIT system) having an image sensing region 1 and a storage region 2 arranged along a vertical direction. The image sensing region 1 has sensor elements (light receiving elements) SE consisting of photodiodes, and vertical shift registers 12 combined respectively with vertical rows of the sensor elements SE. Signal charge stored in the sensor elements SE is read simultaneously by the corresponding vertical shift registers 12 in a vertical blanking interval and transferred at a high speed to vertical shift registers 22 in the storage region 2. Then, the signal charge of the sensor elements SE on each vertical row is transferred to a horizontal shift register 3A or 3B in each horizontal blanking interval. The signal charge of the (2n+1)-th (n is 0 and positive integers) sensor elements SE on each horizontal line is transferred to the horizontal shift register 3A as indicated by the arrows of continuous lines, and the signal charge of the 2n-th sensor element SE on each horizontal line is transferred through a transfer gate 4 to the horizontal shift register 3B as indicated by the arrows of broken lines.

The signal charge of the (2n+1)-th sensor elements SE transferred to the horizontal shift register 3A and the signal charge of the 2n-th sensor elements SE transferred to the horizontal shift register 3B in each horizontal blanking interval are transferred sequentially to signal detectors 5A and 5B in synchronism with horizontal scanning speed in the subsequent horizontal scanning interval. Image signals corresponding to the signal charge of the (2n+1)-th sensor elements SE and image signals corresponding to the signal charge of the 2n-th sensor elements SE are sent out in parallel from the signal detectors 5A and 5B, respectively.

Charge (smear charge) stored in the vertical shift registers 12 of the image sensing region 1 and charge stored in the vertical shift registers 22 of the storage region 2 are transferred at a high speed in the vertical direction immediately before the signal change of the sensor elements SE is transferred to the vertical shift registers 22 of the storage region 2, and the charge is swept off through the horizontal shift register 3A, the horizontal transfer gate 4, the horizontal shift register 3B and a smear gate 6 into a smear drain region 7 to suppress smearing.

Figure 2:
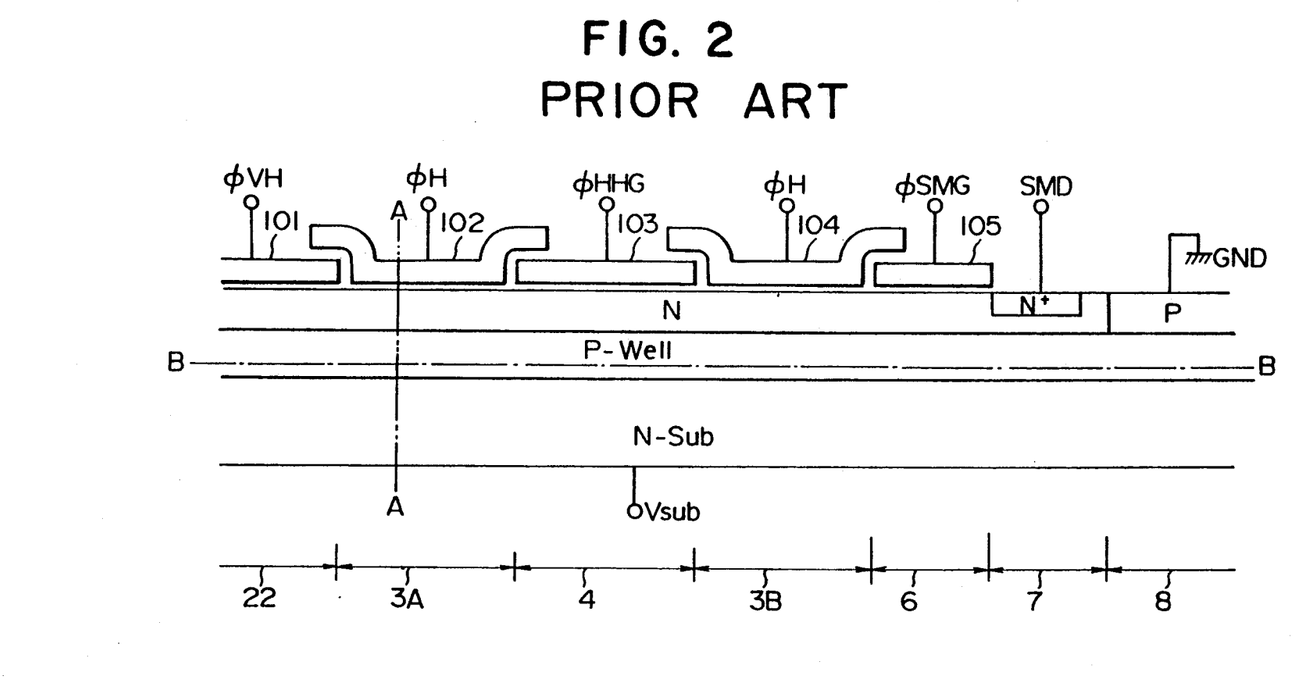
FIG. 2 is a sectional view taken on line I—I in FIG. 1.

FIG. 2 is a sectional view taken on line I—I in FIG. 1, showing an electrode construction. The vertical shift register 22, the horizontal shift register 3A, the horizontal transfer gate 4, the horizontal shift register 3B, the smear gate 6, the smear drain region 7 and a channel stop region 8 are arranged in that order on an n-substrate N-Sub.

A vertical transfer pulse $\psi VH$ is applied to the gate electrode (transfer electrode) 101 of the horizontal shift register 22. A two-phase drive horizontal pulse $\psi H$, for instance, is applied to the respective gate electrodes (transfer electrodes) 102 and 104 of the horizontal shift registers 3A and 3B. A horizontal transfer gate pulse $\psi HHG$ is applied to the gate electrode 103 of the horizontal transfer gate 4. A smear gate pulse $\psi SMG$ is applied to a smear gate electrode 105.

Figure 3:
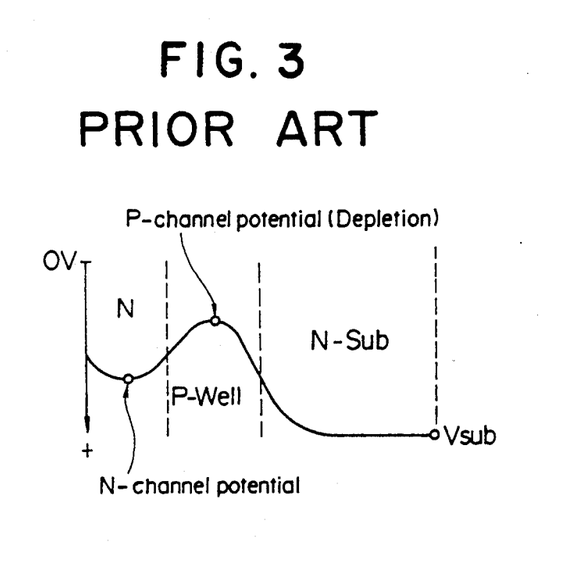
FIG. 3 is a diagram showing the distribution of potential along line A—A in FIG. 2.

A voltage SMD is applied to the smear drain region 7, the channel stop region 8 is grounded and a voltage $V_{sub}$ is applied to an n-substrate N-Sub. FIG. 3 shows the distribution of potential along line A—A in FIG. 2.

A p-well region P-Well corresponding to the horizontal shift registers 3A and 3B are designed so as to be depleted by operating bias voltages for the horizontal shift registers 3A and 3B. Therefore, a hole storage region is created depending on biasing condition and impurity concentration because the smear gate 6, the smear drain region 7 and the horizontal transfer gate 4 isolate the potential of the p-well region P-Well corresponding to the horizontal shift registers 3A and 3B from the ground potential GND.

Figure 4A:
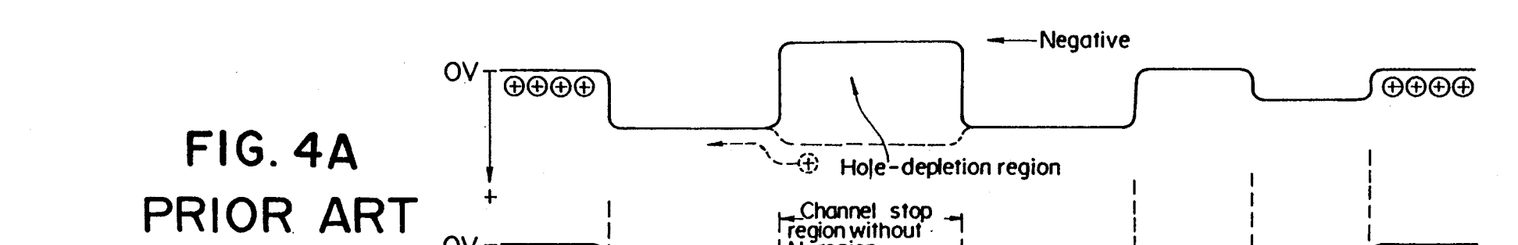
FIGS. 4A and 4B are diagrams showing the distribution of potential along line B—B in FIG. 2.
Figure 4B:
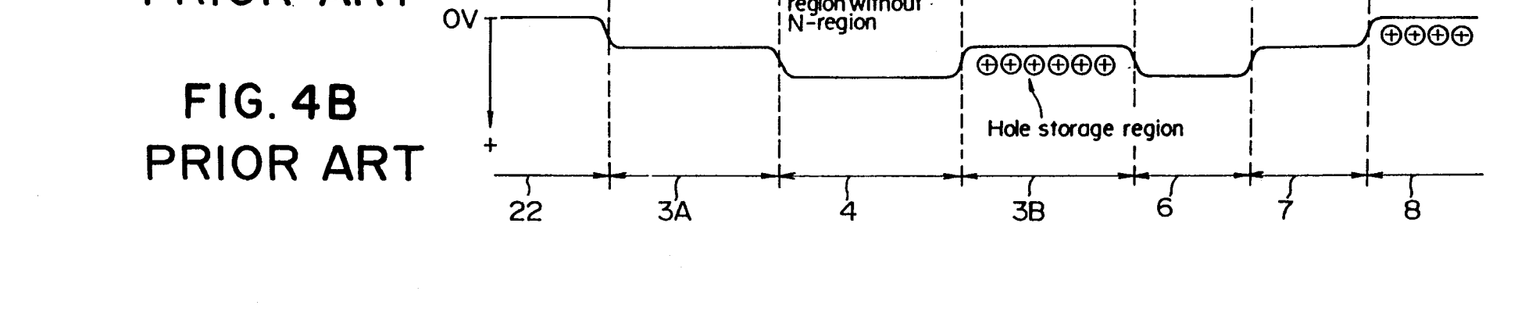

Holes diffused from the gate electrode 103 and those produced by thermal excitation are collected by potential barriers of the p-well region underlying the gate electrodes 103 and 105 and the holes are collected locally and stored in the p-well region corresponding to the gate electrode 104 as shown in FIG. 4B. The potential of a region storing holes is unstable and affects signal transfer adversely.

At the same time, a hole-depletion region is formed. In the hole-depletion region, holes under the gate electrode 103 is emitted when a positive bias voltage is applied to the gate electrode 103 as indicated by a broken line in FIG. 4A and the potential of the p-well region becomes negative potential when the gate electrode 103 is biased again in negative as indicated by a continuous line in FIG. 4A. Consequently, the potential difference between the gate electrodes 102 and 104 increases to produce dark current due to avalanche.

SUMMARY OF THE INVENTION

The present invention stabilizes the potential of the p-well region to prevent the deterioration of signal transfer and prevents dark current by preventing avalanche.

A CCD image sensing device in one aspect of the present invention comprises a first shift register, a horizontal transfer gate, a second horizontal shift register, a smear gate, a smear drain region and a channel stop region arranged in that order, wherein a p-well region underlying the first shift register, a horizontal transfer gate, the second horizontal shift register, the smear gate, the smear drain region and the channel stop region is doped in a high impurity concentration and the potential of the p-well region is equal to that of the channel stop region.

Since the potential of the p-well region is maintained substantially equal to the potential GND of the channel stop region, neither hole storage regions nor hole-depletion regions are formed and no dark current attributable to avalanche is produced. Since the potential of the p-well region is stabilized, signal transfer performance is not deteriorated.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 5:
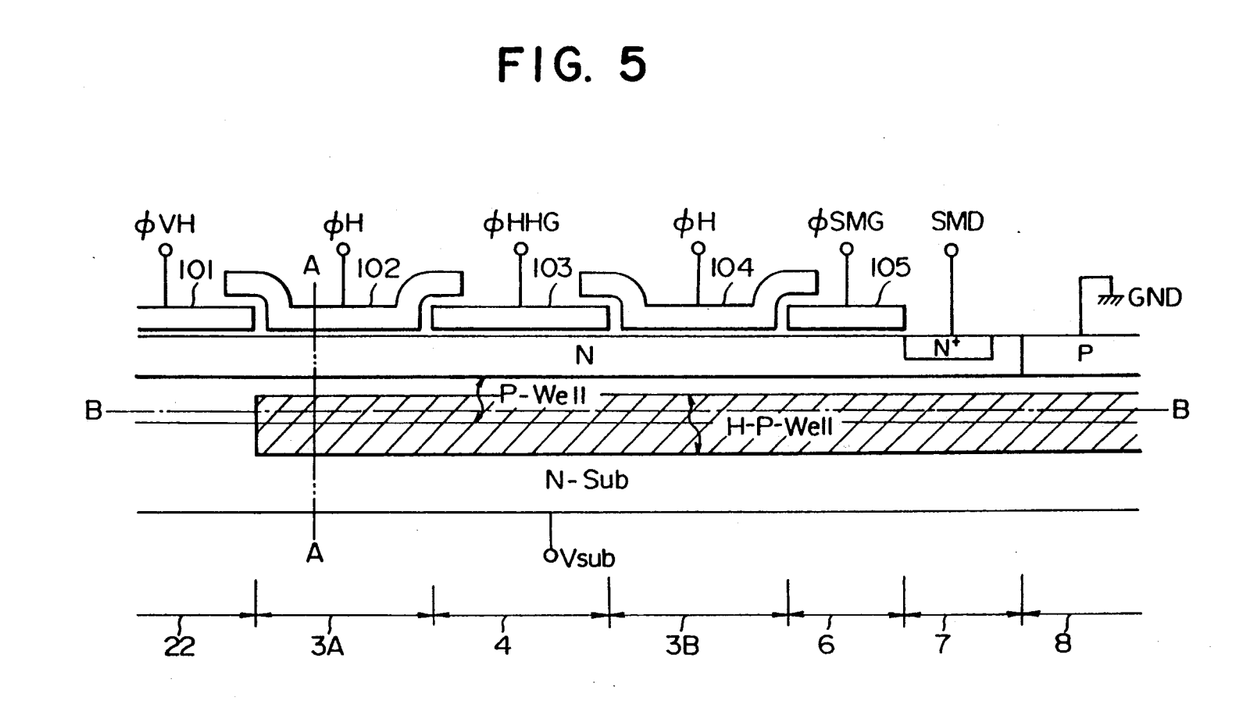
FIG. 5 is a sectional view of a CCD image sensing device in a preferred embodiment according to the present invention.

A CCD image sensing device in a preferred embodiment according to the present invention will be described hereinafter with reference to FIGS. 5 to 7, in which parts corresponding respectively to those shown in FIG. 2 are denoted by the same reference characters and the description thereof will be omitted.

The CCD image sensing device of the present invention is substantially the same in construction as the CCD image sensing device shown in FIG. 2, except that a portion of a p-well region, i.e., hatched portion, underlying horizontal shift registers 3A and 3B, a horizontal transfer gate 4, a smear gate 6, a smear drain region 7 and a channel stop region 8 of the CCD image sensing device of the present invention is a high-impurity p-well region H-P-Well having a high impurity concentration.

Figure 6:
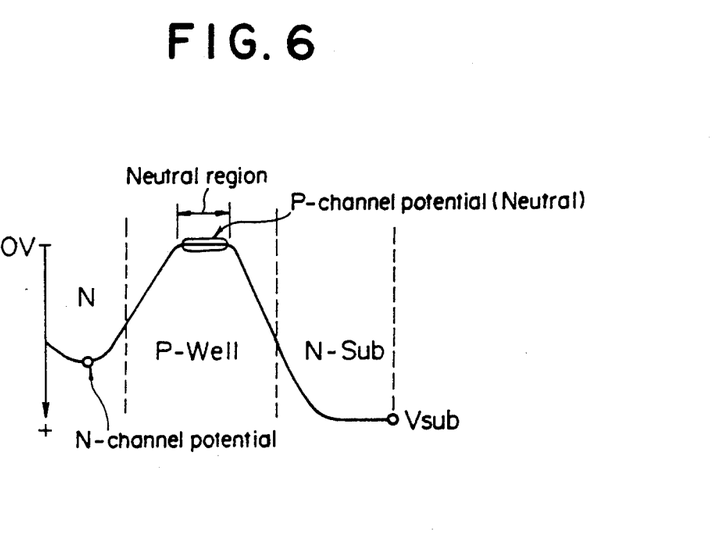
FIG. 6 is a diagram showing the distribution of potential along line A—A in FIG. 5.
Figure 7:
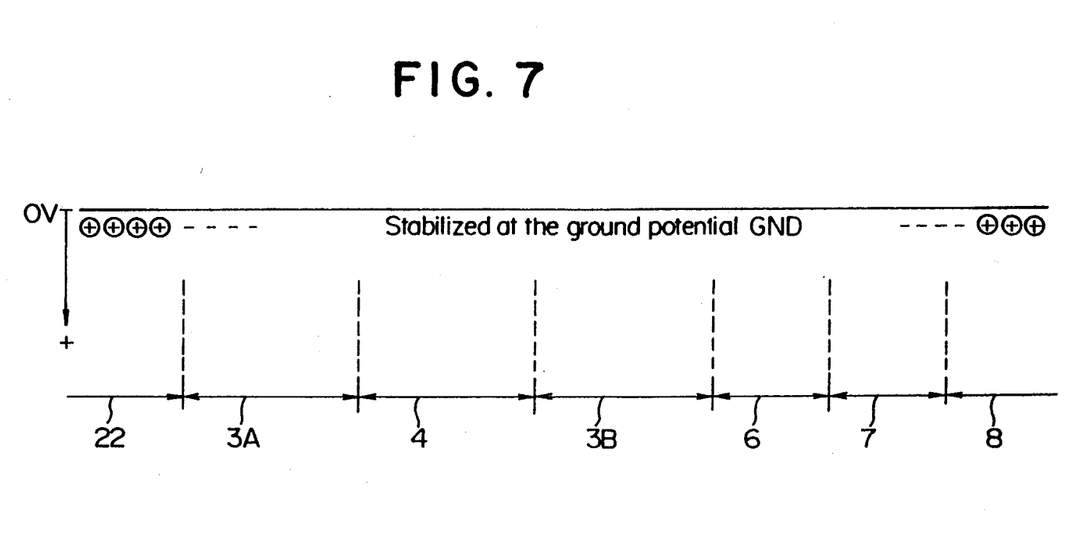
FIG. 7 is a diagram showing the distribution of potential along line B—B in FIG. 5.

As shown in FIG. 6, the high-impurity p-well region H-P-Well has a high impurity concentration and is maintained at a ground potential GND. As shown in FIG. 7, the high-impurity p-well region H-P-Well underlying the horizontal shift registers 3A and 3B, the horizontal transfer gate 4, the smear gate 6 and the smear drain region 7 has a high impurity concentration and the potential of the high-impurity p-well H-P-Well is equal to the ground potential GND corresponding to the potential of the channel stop region 8.

Since the potential of the p-well region is stabilized, no potential barrier is formed in portions of the p-well region corresponding to the gate electrodes 103 and 105, and no hole storage region is formed in a portion of the p-well region corresponding to the gate electrode of the horizontal shift register 3B. Thus, the deterioration of signal transfer performance is obviated.

Since the potential of the p-well region is equal to the ground potential GND, no hole-depletion region is formed. Consequently, the potential of a portion of the p-well region corresponding to the gate electrode 103 does not become negative, and no dark current caused by avalanche due to the large potential difference between the gate electrodes 102 and 104 is produced.

Since the potential of the p-well region of the CCD image sensing device of the present invention is maintained at the potential of the channel stop region, neither hole storage regions nor hole-depletion regions are formed, dark current due to avalanche can be prevented, and the stable potential of the p-well region prevents the deterioration of the signal transfer performance of the CCD image sensing device.

Although the invention has been described in its preferred form with a certain degree of particularity, obviously many changes and variations are possible therein. It is therefore to be understood that the present invention may be practiced otherwise than as specifically described herein without departing from the spirit and scope thereof.

What is claimed is:

1. A CCD image sensing device comprising:
   a. a semiconductor substrate of a first conduction type;
   b. an image sensing region provided with a matrix of light-receiving elements, and a plurality of vertical shift registers for vertically transferring signal charge of the light-receiving elements;
   c. a first horizontal shift register for horizontally transferring the signal charge vertically transferred by the $(2n+1)$-th (n is zero and positive integers) vertical shift registers;
   d. a second horizontal shift register for horizontally transferring the signal charge vertically transferred by the $2n$-th vertical shift registers;
   e. a transfer gate disposed between the first and second horizontal shift registers;
   f. a smear gate, a smear drain region and a channel stop region of a second conduction type disposed on one side of the second horizontal shift register opposite to the other side on which the image sensing region is formed; and
   g. a well region of the second conduction type formed on the semiconductor substrate;
   wherein the potential of the well region of the second conduction type is approximately equal to that of the channel stop region and further wherein the impurity concentration of the well region of the second conduction type is determined so that the potential of the well region of the second conduction type is neutralized by an operating bias voltage for the first and the second horizontal shift registers.

2. A CCD image sensing device comprising:
   a. a semiconductor substrate of a first conduction type;
   b. an image sensing region provided with a matrix of light-receiving elements, and a plurality of vertical shift registers for vertically transferring signal charge of the light-receiving elements;
   c. a first horizontal shift register for horizontally transferring the signal charge vertically transferred by the $(2n+1)$-th (n is zero and positive integers) vertical shift registers;
   d. a second horizontal shift register for horizontally transferring the signal charge vertically transferred by the $2n$-th vertical shift registers;
   e. a transfer gate disposed between the first and second horizontal shift registers;
   f. a smear gate, a smear drain region and a channel stop region of a second conduction type disposed on one side of the second horizontal shift register opposite to the other side on which the image sensing region is formed; and
   g. a well region of the second conduction type formed on the semiconductor substrate;
   wherein the potential of the well region of the second conduction type is approximately equal to that of the channel stop region and the impurity concentration of the well region of the second conduction type is determined so that the potential of the well region of the second conduction type is neutralized by an operating bias voltage for the first and second horizontal shift registers and further wherein a two-phase driving voltage pulse is applied to the first and second horizontal shift registers, and the well region of the second conduction type is neutralized when the two-phase driving voltage pulse is applied to the first and second horizontal shift registers.

3. A CCD image sensing device according to claim 2, wherein a predetermined bias voltage is applied to the smear gate.

4. A CCD image sensing device according to claim 2, wherein a storage region is provided and smear charge produced in the vertical shift registers of the image sensing region and the storage region is swept off through the first horizontal shift register, and transfer gate, the second horizontal shift register and the smear gate into the smear drain region.

* * * * *